United States Patent
Loke et al.

(10) Patent No.: US 7,277,518 B2
(45) Date of Patent: Oct. 2, 2007

(54) LOW-JITTER CHARGE-PUMP PHASE-LOCKED LOOP

(75) Inventors: Alvin Leng Sun Loke, Fort Collins, CO (US); James Oliver Barnes, Fort Collins, CO (US); Robert Keith Barnes, Fort Collins, CO (US); Michael M. Oshima, Los Altos, CA (US); Ronald Ray Kennedy, Fort Collins, CO (US); Charles E. Moore, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 748 days.

(21) Appl. No.: 10/717,778

(22) Filed: Nov. 20, 2003

(65) Prior Publication Data

US 2005/0111605 A1 May 26, 2005

(51) Int. Cl.
*H03D 3/24* (2006.01)
(52) U.S. Cl. .................. 375/373; 375/374; 375/376; 327/148; 327/157; 331/17
(58) Field of Classification Search ................ 375/371, 375/373–376; 327/147, 148, 150, 155–157, 327/159; 331/17, 36 R
See application file for complete search history.

(56) References Cited

U.S. PATENT DOCUMENTS 4,156,855 A   5/1979   Crowley

| 4,857,866 A | 8/1989 | Tateishi |
| 5,767,713 A | 6/1998 | Williams |
| 6,016,332 A * | 1/2000 | Smith et al. ................ 375/376 |
| 6,420,917 B1 | 7/2002 | Klemmer |
| 6,583,675 B2 * | 6/2003 | Gomez ........................ 331/17 |
| 6,614,316 B2 | 9/2003 | Masenas et al. |
| 6,952,124 B2 * | 10/2005 | Pham ......................... 327/156 |

OTHER PUBLICATIONS

US 6,259,289, 07/2001, Klemmer (withdrawn)

* cited by examiner

Primary Examiner—Dac V. Ha

(57) ABSTRACT

A phase-locked loop includes a voltage-controlled oscillator and a charge-pump loop filter. The voltage-controlled oscillator includes a varactor having a first set of capacitor cells configured to adjust a capacitance based on a first control voltage, and a second set of capacitor cells configured to adjust a capacitance based on a second control voltage. The charge-pump loop filter receives a first and a second update signal, each having at least one state based on a phase difference between a first clock and a second clock, and comprises a first component and a second component. The first component is configured to adjust, during an update period, a voltage across an impedance from a reference level based on the states of the first and second update signals and to return the voltage across the impedance to the reference level prior to an end of the update period, wherein the voltage across the impedance comprises the first control voltage. The second component is configured to adjust a voltage across a capacitor based on the states of the first and second input signals, wherein the voltage across the capacitor comprises the second control voltage.

25 Claims, 4 Drawing Sheets

LOW-JITTER CHARGE-PUMP PHASE-LOCKED LOOP

BACKGROUND

A phase-locked loop (PLL) is a negative feedback loop where an output phase of a voltage-controlled oscillator (VCO) can be automatically synchronized ("locked") to a phase of a periodic input signal. The periodic input signal is commonly referred to as the input reference clock. The locking property of the PLL has numerous applications in communication systems such as frequency synthesis, frequency, amplitude, or phase modulation-demodulation, and clock and data recovery. A basic PLL has three components connected in a feedback loop: a VCO, a phase detector, and a loop filter, which is generally some type of low-pass filter. A basic PLL additionally includes a feedback frequency divider in applications where the VCO frequency is designed to be a multiple of a frequency of the input reference clock.

The VCO is an oscillator whose frequency is monotonically modulated by an input voltage. The voltage at the input of the VCO determines the frequency of a periodic signal at the output of the VCO. While the frequency of the VCO can be designed to decrease in response to an increase in the input voltage, VCO's are typically designed so as to increase frequency in response to an increasing input voltage. The only requirement is that when incorporated into the loop, a net polarity of the feedback must be negative.

The VCO output signal and the input reference clock are inputs to the phase detector. The phase detector produces an output voltage signal proportional to a phase difference between the input reference clock and the VCO output signal. The output of the phase detector is filtered by the low-pass loop filter. The loop is closed by connecting the loop filter output to the input of the VCO, such that the loop filter output voltage controls the frequency of the VCO. When the loop is "locked", the phase and frequency of the VCO output are substantially equal to the phase and frequency of the input reference clock.

For monolithically integrated PLL's with low jitter requirements, such as those utilized in high-speed serial data transmission, both coarse and fine control of the VCO are typically desirable, as a single line control is generally not sufficient. Coarse control provides the tuning range necessary for the PLL to lock to its input reference clock amidst process, power supply voltage, and temperature (PVT) fluctuations; uncertainties in circuit modeling during the design process, and flexibility to adjust the input reference frequency for system test purposes. Fine control, with its smaller effect on the VCO output, allows the PLL to track small perturbations in input and voltage-temperature conditions during normal operation while providing high immunity against circuit noise that principally dictate jitter performance.

One conventional low jitter PLL configured as a frequency synthesizer employs a charge-pump loop filter providing the fine control voltage input to a varactor-tuned VCO, wherein the charge-pump loop filter is driven by a sequential phase-frequency detector (PFD). In one conventional implementation, the sequential PFD consists of two positive edge-triggered D (delay) latches and a logical AND-gate. The first latch senses rising edges in the input reference clock and the second latch rising edges in a feedback clock (i.e., VCO output divided by frequency divider) in respectively generating UP and DOWN outputs which serve as control inputs to the charge-pump loop filter. When both the UP and DOWN inputs are asserted HI, the AND-gate generates a RESET signal that clears both latch outputs concurrently, thereby resetting the sequential PFD for the next phase comparison.

The charge-pump loop filter traditionally consists of a pair of current sources that adjust the fine control voltage by adding or subtracting charge to a capacitor of a series connected RC load based on the states of the UP and DOWN inputs from the sequential PFD.

As is described in greater detail in the "Detailed Description" section below, a conventional PLL employing a charge-pump loop filter in this fashion inherently introduces jitter into the VCO output signal.

SUMMARY

One aspect of the present invention provides a phase-locked loop including a voltage-controlled oscillator and a charge-pump loop filter. The voltage-controlled oscillator includes a varactor having a first set of capacitor cells configured to adjust a capacitance based on a first control voltage, and a second set of capacitor cells configured to adjust a capacitance based on a second control voltage. The charge-pump loop filter is configured to receive a first and a second update signal, each having at least one state based on a phase difference between a first clock and a second clock, and comprises a first component and a second component. The first component is configured to adjust, during an update period, a voltage across an impedance from a reference level based on the states of the first and second update signals and to return the voltage across the impedance to the reference level prior to an end of the update period, wherein the voltage across the impedance comprises the first control voltage. The second component is configured to adjust a voltage across a capacitor based on the states of the first and second input signals, wherein the voltage across the capacitor comprises the second control voltage.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
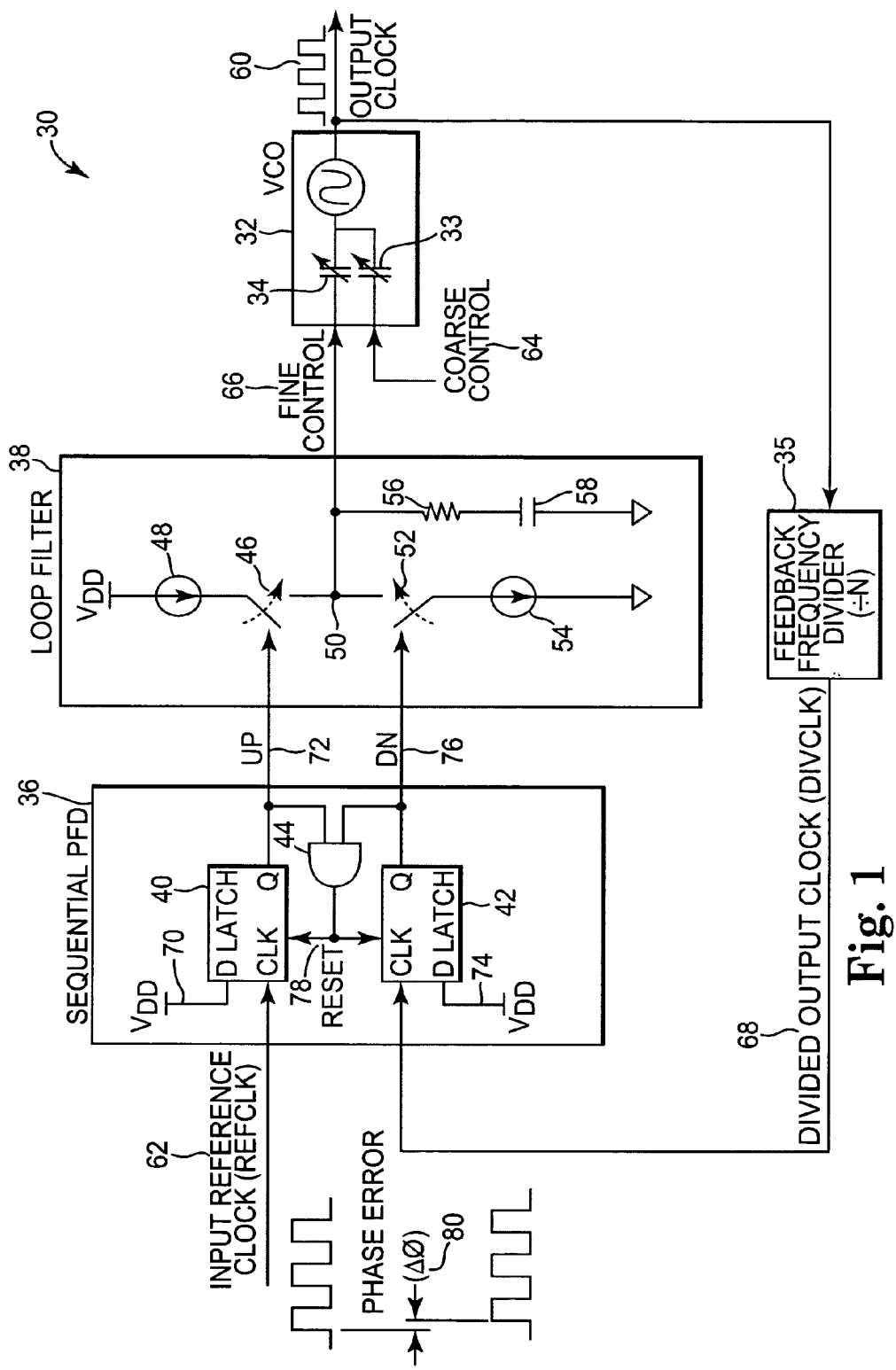
FIG. 1 is a block and schematic diagram illustrating one exemplary embodiment of a conventional charge-pump phase-locked loop.

FIG. 1 is a block and schematic diagram of illustrating one example of a conventional charge-pump phase-locked loop (PLL) 30. PLL 30 includes a voltage controlled oscillator (VCO) 32, a feedback frequency divider 35, a sequential phase-frequency detector (PFD) 36, and a charge-pump loop filter 38. Sequential PFD 36 includes a reference latch 40, a feedback latch 42, and an AND-gate 44. As illustrated, both reference latch 40 and feedback latch 42 are positive edge-triggered D-latches.

Charge-pump loop filter 38 includes a first switch 46 coupled between an associated first current source 48 and a node 50, a second switch 52 coupled between an associated second current source 54 and node 50, and a series-connected resistor 56 and capacitor 58 coupled between node 50 and ground.

As illustrated, PLL 30 is configured as a low-jitter clock multiplier for use in applications such as high-speed serial data transmission. As such, VCO 32 is configured to provide an output clock 60 having a frequency substantially equal to a multiple (N) of a frequency of an input reference clock (REFCLK) 62, wherein the frequency of output clock 60 is based on both a coarse control voltage signal 64 and a fine control voltage signal 66 provided by charge-pump loop filter 38.

Coarse control voltage signal 64 provides a tuning range necessary for VCO 32 to provide output clock 60 at a frequency that enables PLL 30 to "lock" output clock 60 to REFCLK 62 amidst process, power supply voltage, and temperature fluctuations, uncertainties in circuit modeling during the design process, and flexibility to adjust the REFCLK 62 frequency for system test purposes. Feedback frequency divider 35 divides output clock 60 by N to provide a divided clock (DIVCLK) 68 having a frequency substantially equal to the frequency of output clock 60 divided by N.

Reference latch 40 is coupled to a positive digital value via a D input as indicated at 70, receives REFCLK 62 at a CLK input, and provides a first switch control signal 72 via a Q output. Feedback latch 42 is coupled to VDD via a D input as indicated at 74, receives DIVCLK 68 at a CLK input, and provides a second switch control signal 76 via a Q output. First switch control signal 72 and second switch control signal 76 are hereinafter respectively referred to as UP signal 72 and DN (down) signal 76. AND-gate 44 receives UP and DN signals 72 and 76 at a pair of inputs and provides a RESET signal 78 at an output to reference and feedback latches 40 and 42.

In operation, sequential PFD 36 is configured to detect a phase difference (Δø) 80 between REFCLK 62 and DIVCLK 68. For example, if REFCLK 62 is leading DIVCLK 68, reference latch 40 will detect a rising edge of REFCLK 62 before feedback latch 42 detects a rising edge of DIVCLK 68. Upon detecting the rising edge of REFCLK 62, UP signal 72 at the Q output of reference latch 40 is asserted HI. This causes first switch 46 to close and first current source 48 to provide a current to resistor 56 and capacitor 58 via node 50, thereby adding charge to capacitor 58 and causing the voltage level of fine control signal 66 to rise and VCO 32 to correspondingly increase the frequency of output clock 60.

After a "lag" time, feedback latch 42 detects the rising edge of DIVCLK 68 and asserts the DN signal 76 at its Q output HI. This causes second switch 52 to close and second current source 54 to begin conducting current to ground. Ideally, current sources 48 and 54 are substantially matched such that when current source 54 begins conducting, the amount of current flowing into node 50 from first current source 48 is being "pulled away" from node 50 by second current source 54. As a result, there is no net change in the charge of capacitor 58 and, consequently, no further increase in the voltage level of fine control signal 66 or in the frequency of output clock 60.

With both UP signal 72 and DN signal 76 asserted HI, RESET signal 78 at the output of AND-gate is set HI. After a finite delay due to propagation delays in AND-gate 44 and in the response of reference latch 40 and feedback latch 42, UP signal 72 and DN signal 76 are reset LO. This causes first and second switches 46 and 52 to open and RESET signal 78 to be asserted LO in preparation for sequential PFD 36 to receive the next pair of rising edges of REFCLK 62 and DIVCLK 68.

PLL 30 operates in a fashion similar to that described above when REFCLK 62 is lagging DIVCLK 68, except that DN signal 76 is asserted HI prior to UP signal 72. Consequently, second current source 54 conducts prior first current source 48, thereby causing a decrease in the stored charge of capacitor 58 and a corresponding decrease in the voltage level of fine control signal 66 and in the frequency of output clock 60.

The operation of reference latch 40 and feedback latch 42 as described above results in sequential PFD 36 providing UP and DN signals 72 and 76 in the form of voltage pulses having a HI state substantially equal to VDD and a low state substantially equal to ground. The wider of the two pulses corresponds to the earlier or leading clock of the two clocks REFCLK 62 and DIVCLK 68, with the wider pulse being wider than the narrower pulse by the phase difference Δø 80. The width of the narrower pulse is determined by the propagation delays in AND-gate 44 and the reset response time of reference latch 40 and feedback latch 42.

A conventional PLL, such as PLL 30 illustrated above by FIG. 1, is a second-order feedback loop. VCO 32 adjusts the frequency of output clock 60 based on the voltage level of fine control voltage signal so that the phase of DIVCLK 68 substantially matches the phase of input reference clock 62. Since phase is the integral of frequency, changing the frequency of output clock 60 to adjust phase requires VCO 32 to perform a frequency integration. This integration results in VCO 32 introducing a first circuit-pole to PLL 30. Charge-pump loop filter 38 provides a current to capacitor 58 having a duration and direction based on a phase difference between REFCLK 62 and DIVCLK 68 as determined by sequential PFD 36. Capacitor 58 integrates the corresponding charge, resulting in charge-pump loop filter 38 introducing a second circuit-pole to PLL 30.

The first and second circuit poles introduced by VCO 32 and loop filter 38 can potentially introduce 180° of phase lag into the loop, which can cause system instability in PLL 30. In order to offset the intrinsic 180° phase lag and add stability to the loop, PLL systems, such as illustrated by PLL 30, traditionally introduce a resistor, such as resistor 56, in series with charge-integrating capacitor 58 as a form of phase lead compensation. The load of the series-connected resistor 56 and capacitor 58 introduces a feed-forward or loop-stabilizing zero that increases the phase margin of the loop to protect against feedback instability.

While the series-connected load of resistor 56 and capacitor 58 adds stability by introducing a feed-forward zero to the loop, such a configuration has an inherently undesirable characteristic of potentially introducing "jitter-bursts" in output clock 60 upon each phase update of sequential PFD 36 of PLL 30. Such jitter-bursts can limit the utility of PLLs, such as PLL 30, in applications where low-jitter is critical, such high-speed serial data transmitter circuits.

A jitter-burst occurs when there is a phase difference Δø 80 between REFCLK 62 and DIVCLK 68. For example, as described above, when DIVCLK 68 is lagging REFCLK 62, sequential PFD 36 provides UP signal 72 as voltage pulse that closes first switch 46 of loop filter 38 and causes first current source 48 to provide a current pulse to series-connected resistor 56 and capacitor 58 via node 50. The current pulse adds charge to capacitor 58 and causes the voltage level of fine control signal 66 to rise which, in-turn, increases the capacitance of fine control varactor 34 and causes VCO 32 to increase the frequency of output clock 60.

However, since the voltage across capacitor 58 cannot change instantaneously, the current pulse generates a nearly instantaneous voltage across resistor 56. Because of the RC time constant of the series combination of resistor 56 and capacitor 58, a finite amount of time is required for the voltage across resistor 56 to decay. Consequently, the nearly instantaneous voltage across resistor 56 appears as a nearly instantaneous increase in the voltage level of fine control 66 and causes a momentary "jump" in the frequency of output clock 60. This momentary frequency jump causes a phase jump in output clock 60, commonly referred to as a jitter burst.

The voltage level of fine control signal 66 provided by the series-connected load of resistor 56 and capacitor 58 can be described by Equation I below:

$$V_{FC}=I \times (R+1/sC);$$ Equation I where: I=current from either first current source 48 or second current source 54;
R=resistance of resistor 56; and
C=capacitance of capacitor 58.
Using the distributive axiom, Equation I can be rewritten as Equation II below:

$$V_{FC}=(I \times R)+(I \times 1/sC).$$ Equation II

Figure 2:
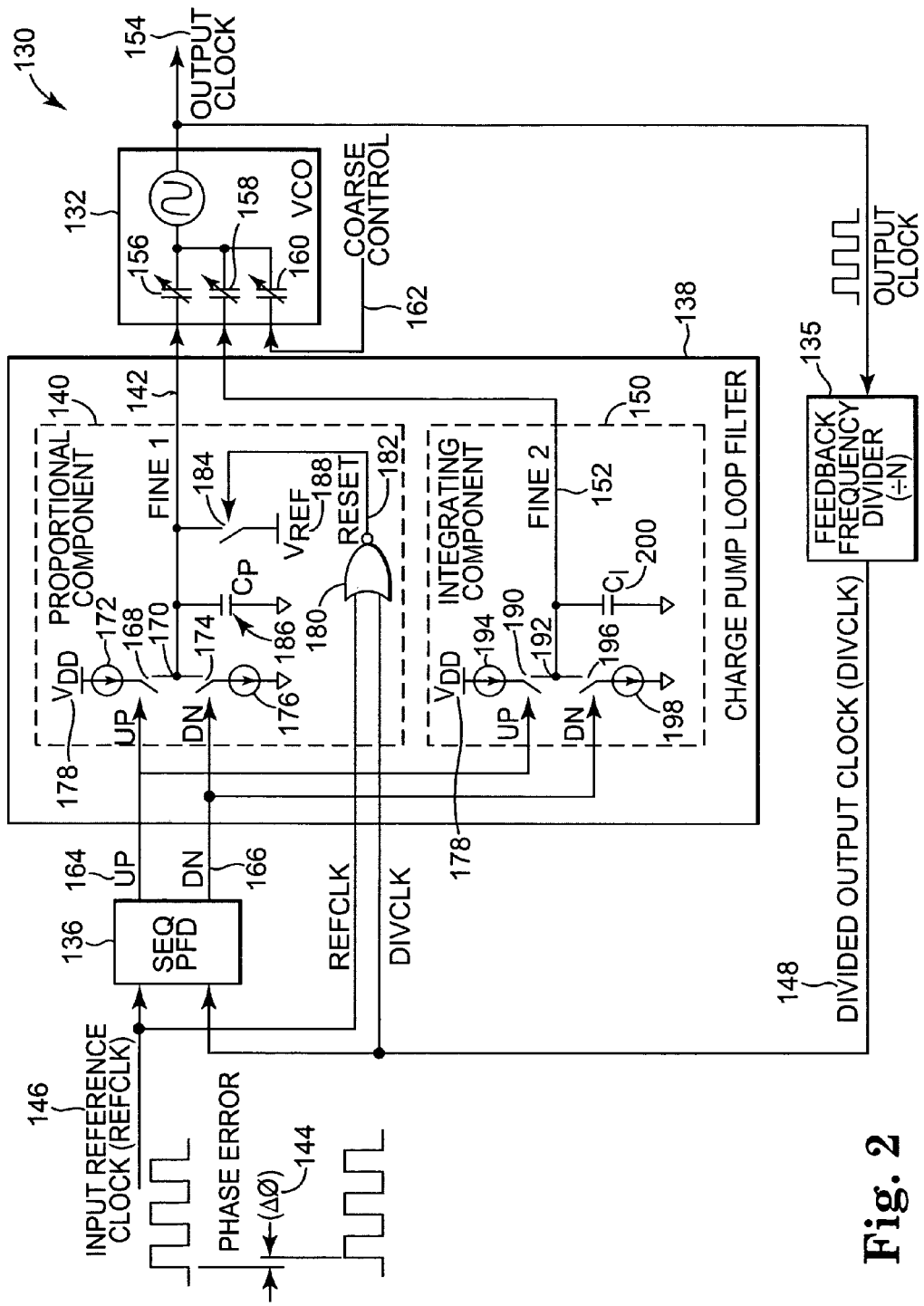
FIG. 2 is a block and schematic diagram illustrating one exemplary embodiment of a charge-pump phase-locked loop employing a phase detector system according to the present invention.

The first voltage component provided by resistor 56 is proportional to the phase difference Δø 80 and primarily functions to adjust the phase of output clock 60, while the second voltage component provided by capacitor 58 is proportional to the integral of the phase difference Δø 80 and primarily functions to adjust the frequency of output clock 60. As such, the first voltage component is hereinafter referred to as the proportional control voltage and the second voltage component as the integrating control voltage. Thus, Equation II can be stated in generalized terms as Equation III below:

$$V_{FC}=(\text{Proportional Control Voltage})+(\text{Integrating Control Voltage}).$$ Equation III FIG. 2 is a block and schematic diagram of a PLL 130 according to one embodiment of the present invention. PLL 130 includes a voltage-controlled (VCO) 132, a feedback frequency divider 135, a sequential phase-frequency detector (PFD) 136, and a charge-pump loop filter 138. Charge pump loop filter 138 includes a proportional component 140 providing a first fine control signal 142 having a voltage level proportional to a phase difference (Δø) 144 between an input reference clock (REFCLK) 146 and a divided output clock (DIVCLK) 148. Charge pump loop filter 138 further includes an integrating component 150 providing a second fine control signal 152 having a voltage level proportional to an integral of the phase difference Δø 144. Proportional component 140 and integrating component 150 operate together to adjust the phase and frequency of an output clock 154 provided by VCO 132, with proportional component 140 functioning to make phase adjustments to output clock 154 and integrating component 150 functioning to make frequency adjustments to output clock 154.

As illustrated, PLL 130 is configured as a low-jitter clock multiplier for use in applications such as high-speed serial data transmission. As such, VCO 132 is configured to provide output clock 154 at a frequency that is substantially equal to a multiple (N) of a frequency of REFCLK 146. VCO 132 includes a first set 156 of voltage-tunable capacitor cells receiving first fine control signal 142, a second set 158 of voltage-tunable capacitor cells receiving second fine control signal 152, and a third set 160 of voltage-tunable capacitor cells receiving a coarse control signal 162.

Coarse control voltage signal 162 provides a tuning range necessary for VCO 132 to provide output clock 154 at a frequency that enables PLL 130 to "lock" output clock 154 to REFCLK 146 amidst process, power supply voltage, and temperature fluctuations, uncertainties in circuit modeling during the design process, and flexibility to adjust the REFCLK 146 frequency for system test purposes. Feedback frequency divider 135 divides output clock 154 by N to provide DIVCLK 148 having a frequency substantially equal to the frequency of output clock 154 divided by N. Sequential PFD 136 provides an "up" signal (UP) 164 and a "down" signal (DN) 166, each having a state based on REFCLK 146 and DIVCLK 148.

Proportional component 140 includes a switch 168 coupled between a node 170 and an associated current source 172, and is configured to open and close in response to UP signal 164. A switch 174 is coupled between node 170 and an associated current source 176, and is configured to open and close in response to DN signal 166. Current source 172 is coupled between switch 168 and a power supply voltage (VDD) 178, and current source 176 is coupled between switch 174 and ground. A NOR-gate 180 receives REFCLK 146 and DIVCLK 148 at a pair of inputs, and provides a RESET signal 182 at an output.

Proportional component 140 further includes a reset switch 184 and a proportional voltage capacitor ($C_P$) 186. Reset switch 184 is coupled between node 170 and a reference voltage ($V_{REF}$) 188 and is configured to open and close in response to RESET signal 182. Reset switch 184 is normally-closed, thereby coupling $V_{REF}$ to node 170 and normally maintaining proportional voltage capacitor 186 at a voltage level substantially equal to $V_{REF}$. In one embodiment, $V_{REF}$ is at a level between GND and $V_{DD}$ corresponding to a center-point of a capacitive tuning range of first set 156 of voltage-tunable capacitor cells of VCO 132. Capacitor 186 is one example of a suitable impedance component that may be employed to provide the proportional voltage level of first fine control signal 142.

Integrating component 150 further includes a switch 190 coupled between a node 192 and an associated current source 194, and is configured to open and close in response to UP signal 164. A switch 196 is coupled between node 192 and an associated current source 198, and is configured to open and close in response to DN signal 166. Current source 194 is coupled between switch 190 and $V_{DD}$ 178, and current source 198 is coupled between switch 196 and ground. Integrating component 150 further include an integrating capacitor ($C_I$) 200 configured to provide the integrated voltage level of second fine control signal 152.

Figure 3:
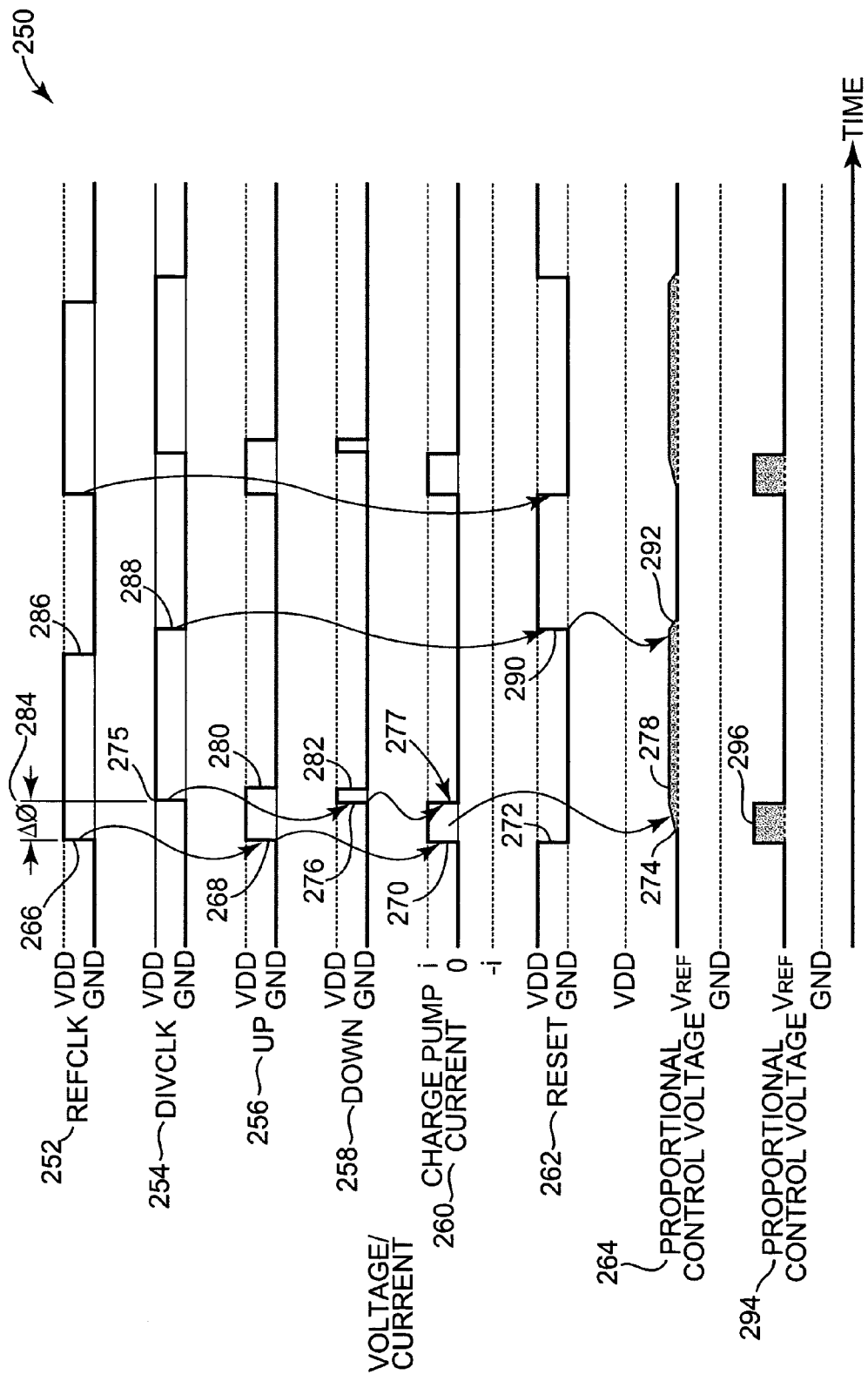
FIG. 3 is a timing diagram illustrating an example operation of the phase detector system according to the present invention as illustrated by FIG. 2.

FIG. 3 is an example timing diagram 250 illustrating an example operation of the proportional component 140 of PLL 130 as illustrated in FIG. 2. Timing diagram 250 illustrates the operation of proportional component 140 when DIVCLK 148 lags REFCLK 146. Waveforms representative of REFCLK 146, DIVCLK 148, UP signal 164, DN signal 166, charge pump current (i.e., provided by current source 172), RESET signal 182, and the proportional control voltage across capacitor 186 are respectively indicated at 252, 254, 256, 258, 260, 262, and 264. Time is indicated by the x-axis and voltage or current, depending on the particular waveform, by the y-axis.

When a rising edge 266 of REFCLK 146 is detected by sequential PFD 136, UP signal 164 is set from ground (GND) to supply voltage $V_{DD}$ as indicated at 268. This causes switch 168 to close and a charge pump current from current source 172 to flow to capacitor 186 via node 170, as indicated at 270. Also, with only REFCLK 146 HI, RESET signal 182 at the output of NOR-gate 180 is set from $V_{DD}$ to ground, as indicated at 272, causing normally-closed switch 184 to open and disconnect $V_{REF}$ from node 170. With $V_{REF}$ disconnect from node 170, the charge pump current from current source 172 begins to add charge to proportional voltage capacitor 186, and the proportional control voltage across capacitor 186 begins to ramp up to a voltage level greater than $V_{REF}$, as indicated at 274.

When a rising edge 275 of DIVCLK 148 is detected by sequential PFD 136, DN signal 164 is set from GND to supply voltage $V_{DD}$ as indicated at 276. This causes switch 174 to close and current source 176 to begin conducting current to ground. With current sources 172 and 176 being substantially matched, the amount of current flowing into node 170 from current source 172 is being "drained away" by current source 176 and, consequently, there is no net current flowing to capacitor 186 as indicated at 277. As a result, no additional charge is added to capacitor 186 and the proportional control voltage level across capacitor 186 ceases rising and stabilizes at a level greater than $V_{REF}$ but less than $V_{DD}$ as indicated at 278.

With both UP and DN signals 164 and 166 at $V_{DD}$, sequential PFD 136, after propagation delays internal to sequential PFD 136 (e.g., refer to sequential PFD 36 of FIG. 1), sets both UP and DN signals 164 and 166 to GND as respectively indicated at 280 and 282. The width of the pulse of UP signal 164 exceeds the width of the pulse of DN signal 166 by the phase difference (Δø) between REFCLK 146 and DIVCLK 148 as indicated at 284.

After a half-cycle of REFCLK 146 has elapsed, REFCLK 146 transitions to ground as indicated at 286. After approximately a half-cycle of DIVCLK 148 has elapsed, DIVCLK 148 transitions to ground as indicated at 288. With both REFCLK 146 and DIVCLK 148 at ground, RESET signal 182 at the output of NOR-gate 180 is set to $V_{DD}$, as indicated at 290. This causes reset switch 184 to once again close and, in-turn, causes proportional voltage capacitor 186 to discharge and the proportional voltage level across capacitor 186 to ramp back down to $V_{REF}$ as indicated at 192.

The operation of integrating component is not illustrated by timing diagram 250 of FIG. 2. However, capacitor 200 of integrating component 150 is charged in a fashion similar to that of capacitor 58 of FIG. 1, with charge being added or subtracted by current sources 194 and 198 based on the states of UP and DN signals 164 and 166.

Waveform 294 represents the proportional control voltage provided at node 170 if the impedance component of proportional component 140 is a resistor rather than capacitor 186. In such a configuration, the resistor is coupled between node 170 and $V_{REF}$, and NOR-gate 182 and reset switch 184 are removed from proportional component 140. As indicated by waveform 294, the proportional voltage pulse 296 provided by the resistor has a width equal to the phase error 284. Proportional voltage pulse 296 coincides with the current pulse from current source 172, as indicated by waveform 260, and has a value that exceeds $V_{REF}$ by the product of the resistance multiplied by the current level.

While a resistor may be employed to provide the proportional control voltage, the voltage pulses 296 is of a magnitude and a duration that may introduce jitter-bursts into output clock 154, as described above by FIG. 1. Employing capacitor 186 as the impedance element is the preferable implementation, as compared to a resistor, for proportional component 140. As illustrated by waveform 264, the proportional control voltage pulse provided by capacitor 186 is stretched-out over time as compared to voltage pulse 296 provided by a resistive element.

At the start of a phase update, which coincides with the detection of rising edge 266 of REFCLK 146 when DIVCLK 148 lags REFCLK 146, proportional component 140 is tri-stated by opening reset switch 184 to isolate node 170 from $V_{REF}$. Current source 172 then feeds a current into node 170, and the phase error Δø 144 is integrated onto capacitor 186, resulting in capacitor 186, and thus node 170, storing a voltage deviating from $V_{REF}$.

Node 170 is held in this tri-stated condition until both REFCLK 146 and DIVCLK 148 are disabled, at which time reset switch 184 is closed and capacitor 186 discharges to $V_{REF}$. The net effect of the operation of proportional component 140 is to produce a voltage pulse whose amplitude relative to $V_{REF}$ is proportional to the input phase error Δø 144 between REFCLK 146 and DIVCLK 148, and whose duration is a controlled fraction of a period of REFCLK 146.

While proportional component 140 performs an initial integration when current source 172 provides current to capacitor 186, because capacitor 186 is discharged prior to each phase update, there is no net integration of the previous phase update's phase error. This initial integration also occurs over a short time period relative to the phase update rate and, thus, is not felt by the PLL.

By providing a voltage pulse who amplitude is proportional to the input phase error and whose duration is a controlled fraction of the input reference clock, proportional component 140 according to the present invention provides PLL 130 with phase lead compensation that reduces the effects of jitter bursts on system performance as compared to a conventional PLL employing a standard series-connected resistor and capacitor for phase compensation. By stretching the proportional control voltage pulse over time, the magnitude of the voltage pulse can be decreased for a given phase lead compensation relative to a control voltage provided by a series RC load, thereby reducing the magnitude of jitter bursts in output clock 154 of VCO 132.

Proportional component 140 of charge pump loop filter 138 provides PLL 130 with other benefits as well. Because the duration of the proportional control voltage pulse is determined by the clock (i.e., REFCLK 146 or DIVCLK 148) with the larger duty cycle, the effective gain of charge-pump loop filter 138 can be modulated by the duty cycle of REFCLK 146 and DIVCLK 148. This enables charge-pump loop filter 138 to provide a gain that is insensitive to varying duty cycles of a provided REFCLK 146 if the pulse duration is determined by DIVCLK 148.

The lower voltage magnitude of the proportional control voltage pulse also mitigates non-ideality in current sources 172 and 176. A metal-oxide semiconductor (MOS) transistor is one example of a voltage-controlled current source. Ideally, the current conducting characteristics of the MOS transistor should not be affected by the voltage across its drain and source terminals. In reality, however, due to non-idealities in the MOS transistor structure, the drain to source current depends on the drain to source voltage. By reducing the magnitude of the variations of the voltage at either the drain or source terminal of the MOS transistor current source, the present invention reduces variations in the drain-source voltage and thus improves current source performance. This is especially true in low-voltage deep sub-micron CMOS technologies where current source have very low output resistances.

Stretching the proportional voltage pulse over time also enables proportional component 140 of charge pump loop filter 138 to provide large phase lead compensation to PLL 130 that is not attainable using a conventional charge-pump loop filter, such as charge-pump loop filter 38 of FIG. 1. This can be useful in applications demanding large amounts of available phase lead compensation where loop stability is critical but jitter performance is not.

Also, proportional component 140 does not require a resistor, such as resistor 56 for phase lead compensation. Resistors can be difficult to integrate monolithically in a practical integrated circuit and can be prohibitively expensive owing to area requirements and/or special process technology features for efficient implementation. Also, as will be discussed in greater detail below, resistors are difficult to be made programmable and less amenable for tuning PLL dynamics.

A key operating characteristic of a PLL is its bandwidth, which essentially dictates the response time of the PLL, or how quickly the VCO is able to track changes in the input reference clock. Generally, two sources of noise factor into the determination of a PLL's bandwidth, external noise and internal noise. External noise is typically in the form of jitter in the input reference clock. Generally, it is desirable that the PLL track only slow moving changes in the input reference clock, not jitter. To achieve this, a low PLL bandwidth is desirable. Internal noise is generated by circuits within the PLL. Generally, it is desirable that the PLL be able to correct for internally generated noise. In other words, it is desirable for the PLL to be able to correct for itself. To achieve this, a high PLL bandwidth is desirable.

These two opposing requirements create an optimization problem. Typically, it is desirable to achieve some optimal bandwidth that rejects the external noise while simultaneously tracking at least some of the internal noise. Thus, being able to control a PLL's bandwidth for different applications is critical.

Referring to Equation I above, the total impedance of the series connected resistor 56 and capacitor 58 is indicated as the sum of R+1/sC. Rewriting this sum with a common denominator results in the total impedance being represented as (sCR+1)/sC, wherein the sCR+1 represents the feed-forward zero as described above. Thus, the magnitude of the resistance and the capacitance sets the cut-off frequency for the PLL's bandwidth. Therefore, the PLL's bandwidth can be adjusted by controlling the magnitude of resistor 56. However, since charge-pump loop filter 138 according to one embodiment of the present invention, does not include a phase compensating resistor, such as resistor 56, the amount of phase compensation provided by proportional component 140 must be controlled in order to adjust the bandwidth of PLL 130.

Figure 4:
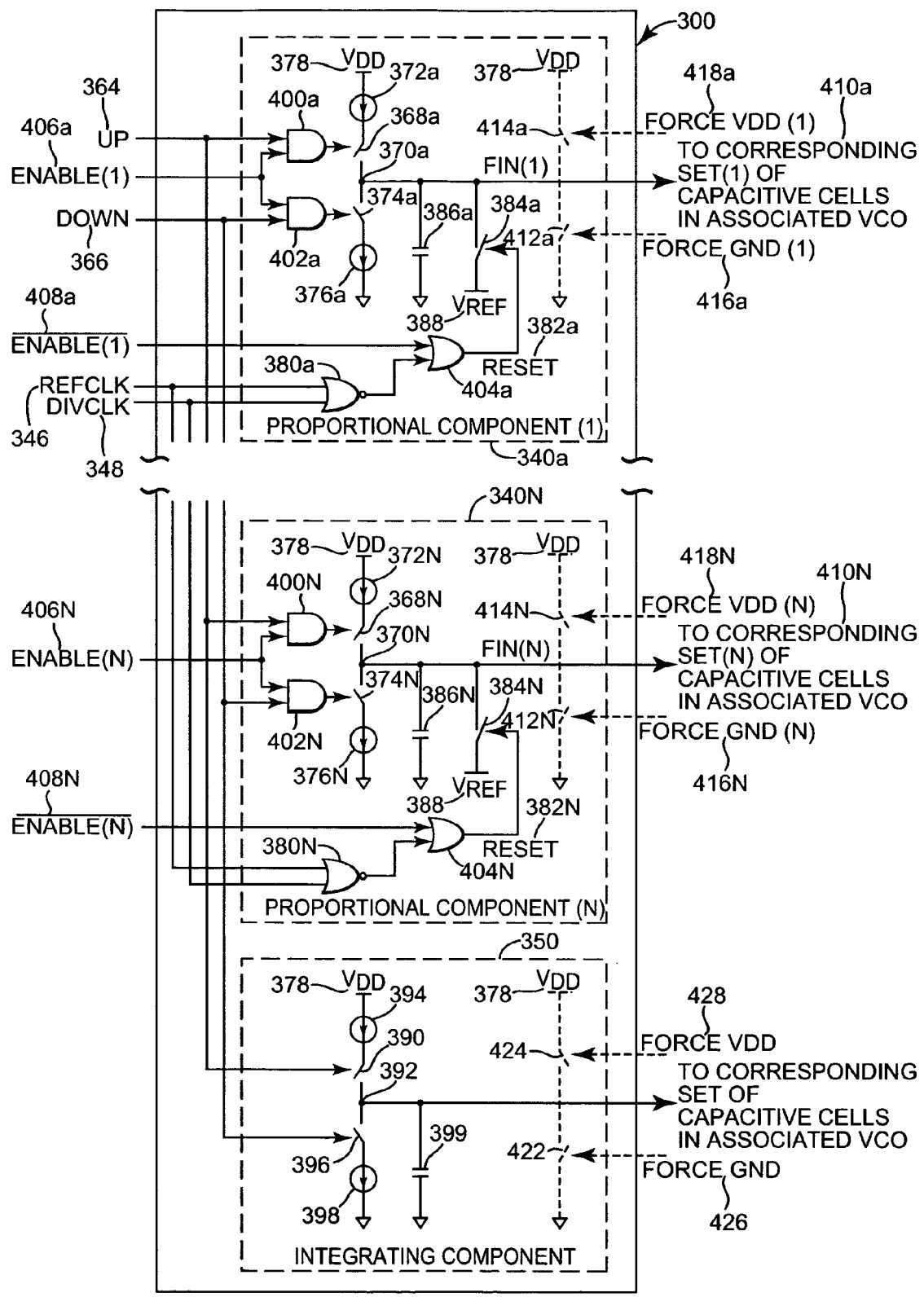
FIG. 4 is a block and schematic diagram illustrating one exemplary embodiment of a phase detector system according to the present invention.

FIG. 4 is a schematic diagram illustrating a charge pump loop filter 300 according to one embodiment of the present invention employing multiple proportional components 340 which can be selectively enabled to control the phase compensation provided by charge-pump loop filter 300. As illustrated, charge-pump loop filter 300 includes N proportional components, indicated as 340a to 340N, and an integrating component 350.

Each proportional component 340 includes a switch 368 coupled between a node 370 and an associated current source 372. A switch 374 is coupled between node 370 and a current source 376. Current source 372 is coupled between switch 368 and a power supply voltage ($V_{DD}$) 378, and current source 376 is coupled between switch 374 and ground. A NOR-gate 380 receives a reference clock (REFCLK) 346 and a divided feedback clock (DIVCLK) 348 at a pair of inputs and has an output. A reset switch 384 is coupled between node 370 and a reference voltage ($V_{REF}$) 388, and a proportional voltage capacitor 386 is coupled between node 370 and ground.

Each proportional component 340 further includes a first AND-gate 400, a second AND-gate 402, and an OR-gate 404. First AND-gate 400 receives at a first input an UP signal 364 from an associated sequential PFD, such as sequential PFD 136 of FIG. 3, a corresponding enable signal 406 at a second input, and provides a switch control signal at its output to switch 368. Second AND-gate 402 receives at a first input a DOWN signal 366 from the associated sequential PFD, the corresponding enable signal 406 at a second input, and provides a switch control signal at its output to switch 374. OR-gate 404 receives the inverse of enable signal 406, indicated as 408, at a first gate, the output of NOR-gate 380 at a second input, and provides a RESET signal 382 to reset switch 384.

Each proportional component 340a to 340N receives a separate enable signal 406a to 406N. When the corresponding enable signal 406 of proportional component 340 is asserted HI, AND-gates 400 and 402 respectively pass UP and DOWN signals 364 and 364 to switches 368 and 374. Also, with enable signal 406 asserted high, its inverse at 408 is necessarily LO, and RESET signal 382 at the output of OR-gate 404 has a state based on the output of NOR-gate 380. Thus, when enable signal 406 is asserted HI, proportional component 340 operates in a fashion similar to that of proportional component 140 as described above by FIG. 2 to provide a proportional control voltage, to a corresponding set of voltage-tunable capacitor cells 410 in an associated VCO, such as set 156 of VCO 132 as illustrated by FIG. 2.

When the corresponding enable signal 406 of proportional component 340 is asserted LO, AND-gates 400 and 402 respectively block UP and DOWN signals 364 and 366 from being passed to switches 368 and 374. Also, with enable signal 406 asserted LO, its inverse at 408 is necessarily asserted HI, thereby causing RESET signal 382 to close switch 384 regardless of the output of NOR-gate 380. With switch 384 open, node 370 is forced to $V_{REF}$, and a proportional control voltage having a level substantially equal to $V_{REF}$ is provided to the corresponding set of voltage-tunable cells 410.

By selectively enabling and disabling varying combinations of proportional components 340 through enable signals 406, charge-pump loop filter 300 can control the phase compensation of an associated PLL, such as PLL 130 of FIG. 2.

Integrating component 350 further includes a switch 390 coupled between a node 392 and an associated current source 394. A switch 396 is coupled between node 392 and a current source 398. Current source 394 is coupled between switch 390 and $V_{DD}$ 378, and current source 398 is coupled between switch 396 and ground. An integrating capacitor 399 is coupled between node 392 and ground. Integrating component 350 operates in a fashion similar to that of integrating component 140 as described above by FIG. 2 to provide an integrated control voltage, to a corresponding set of voltage-tunable capacitor cells 420 in an associated VCO, such as set 158 of VCO 132 as illustrated by FIG. 2. Although charge-pump loop filter 300 of FIG. 4 is illustrated as having a single integrating component 350, in other embodiments, charge-pump loop filter 300 can include multiple integrating components 350 that can be selectively enabled in a fashion similar to that described above for proportional components 340.

In one embodiment, proportional components further include a normally-open switch 412 coupled between node 370 and ground, and a normally-open switch 414 coupled between node 370 and $V_{DD}$ 378. Switch 412 is configured to close in response to a ground signal 416 to force node 372 to ground, and switch 414 is configured to close in response to a $V_{DD}$ signal 418 to force node 372 to $V_{DD}$ 378. Switches 412 and 414 are employed for testing purposes. Each proportional component 340 receives separate signals 416 and 418 to enable individual testing of proportional components 340. Similarly, in one embodiment, integrating component 350 includes a switch 422 configured to close in response to a ground signal 426 to force node 392 to ground, and a switch 424 configured to close in response to a $V_{DD}$ signal 428 to force node 392 to $V_{DD}$ 378.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A phase-locked loop (PLL) comprising:
   a voltage controlled oscillator including a varactor having a first set of capacitor cells configured to adjust a capacitance based on a first control voltage, and a second set of capacitor cells configured to adjust a capacitance based on a second control voltage; and
   a charge-pump loop filter configured to receive a first and a second update signal each having at least one state based on a phase difference between a first clock and a second clock, and comprising:
      a first component configured to adjust, during an update period, a voltage across an impedance from a reference level based on the states of the first and second update signals and to return the voltage across the impedance to the reference level prior to an end of the update period, wherein the voltage across the impedance comprises the first control voltage; and
      a second component configured to adjust a voltage across a capacitor based on the states of the first and second input signals, wherein the voltage across the capacitor comprises the second control voltage.

2. The PLL of claim 1, wherein the impedance comprises a capacitor.

3. The PLL of claim 1, wherein the first clock comprises an input reference clock and the second clock comprises a feedback clock.

4. The PLL of claim 1, wherein the first control voltage is substantially proportional to the phase difference.

5. The PLL of claim 1, wherein the second control voltage is substantially proportional to an integral of the phase difference.

6. The PLL of claim 1, wherein the first control voltage adjusts a phase of the second clock.

7. The PLL of claim 1, wherein the second control voltage adjusts a frequency of the second clock.

8. The PLL of claim 1, wherein the update period comprises a clock period of the first clock.

9. The PLL of claim 1, wherein the voltage across the impedance has a level adjusted from the reference level for a duration based on the first and second clocks.

10. The PLL of claim 1, wherein the first component is configured to provide the first control voltage at a level substantially equal to ground in response to a first test signal and substantially equal to a power supply voltage in response to a second test signal, and wherein the second component is configured to provide the second control voltage at a level substantially equal to ground in response to a first test signal and substantially equal to a power supply voltage in response to a second test signal.

11. The PLL of claim 1, wherein the first component comprises:
   a first current source coupled to a power supply voltage;
   a first switch coupled between the first current source and an output node, and configured to open and close based on the first update signal;
   a second current source coupled to ground;
   a second switch coupled between the second current source and the output node, and configured to open and close based on the second update signal;
   a capacitor coupled between the supply node and ground, wherein a voltage across the capacitor comprises the first control voltage;
   a NOR-gate receiving the first and second clocks at a pair of inputs and providing a reset signal at an output; and
   a third switch coupled between the output node and a reference voltage and configured to open and close based on the reset signal.

12. The PLL of claim 11, wherein the first current source provides a current from the voltage source to the output node when the first switch is closed, and the second current source provides a current from the output node to ground when the second switch is closed.

13. The PLL of claim 1, wherein the second component comprises:
   a first current source coupled to a power supply voltage;
   a first switch coupled between the first current source and an output node, and configured to open and close based on the first update signal;
   a second current source coupled to ground;
   a second switch coupled between the second current source and the output node, and configured to open and close based on the second update signal; and
   a capacitor coupled between the output node and ground, wherein a voltage across the capacitor comprises the second control voltage.

14. The PLL of claim 13, wherein the first current source provides a current from the voltage source to the output node when the first switch is closed, and the second current source provides a current from the output node to ground when the second switch is closed.

15. The PLL of claim 1, where in the charge pump loop filter comprises:
a plurality of first components, each configured to adjust, during the update period, a voltage across a corresponding impedance from a reference level based on the state of the first and second update signals and to return the voltage across the impedance to the reference level prior to the end of the update period, wherein the voltage across the impedance comprises a corresponding first control voltage for controlling a corresponding set of capacitor cells of the voltage controlled oscillator, and wherein each of the first components of the plurality of first components is configured to be selectively enabled or disabled to adjust a phase lead compensation of the PLL.

16. The PLL of claim 1, wherein the charge pump loop filter comprises:
a plurality of second components, each configured to adjust a voltage across a capacitor based on the states of the first and second input signals, wherein the voltage across the capacitor comprises a corresponding second control voltage for controlling a corresponding set of capacitor cells of the voltage controlled oscillator, and wherein each of the second components is configured to be selectively enabled or disabled.

17. A charge-pump loop filter for a phase-locked loop including voltage controlled oscillator including a varactor having a first set of capacitor cells configured to adjust a capacitance based on a first control voltage, and a second set of capacitor cells configured to adjust a capacitance based on a second control voltage, the charge-pump loop filter configured to receive a first and a second update signal each having at least one state based on a phase difference between a first clock and a second clock, the charge-pump loop filter comprising:
a first component configured to adjust, during an update period, a voltage across a first capacitor from a reference level based on the states of the first and second update signals and to return the voltage across the first capacitor to the reference level prior to an end of the update period, wherein the voltage across the first capacitor comprises the first control voltage; and
a second component configured to adjust a voltage across a second capacitor based on the states of the first and second input signals, wherein the voltage across the second capacitor comprises the second control voltage.

18. The charge-pump loop filter of claim 17, wherein the first control voltage is substantially proportional to the phase difference.

19. The PLL of claim 17, wherein the second control voltage is substantially proportional to an integral of the phase difference.

20. The PLL of claim 17, wherein the first control voltage adjusts a phase of the second clock.

21. The charge-pump loop filter of claim 17, wherein the second control voltage adjusts a frequency of the second clock.

22. The charge-pump loop filter of claim 17, wherein the update period comprises a clock period of the first clock.

23. A method of operating a charge-pump phase-locked loop having a voltage controlled oscillator including a varactor having a first set of capacitor cells configured to adjust a capacitance based on a first control voltage, and a second set of capacitor cells configured to adjust a capacitance based on a second control voltage, the method comprising:
receiving a first and second update signal each having at least one state based on a phase difference between a first clock and a second clock;
providing the first control voltage having a level substantially proportional to the phase difference, including adjusting, during an update period, a voltage across an impedance from a reference level based on the states of the first and second update signals and to return the voltage across the impedance to the reference level prior to an end of the update period, wherein the voltage across the impedance comprises the first control voltage; and
providing the second control voltage having a level substantially proportional to an integral of the phase difference clock.

24. The method of claim 23, wherein said impedance comprises a capacitor.

25. The method of claim 23, wherein providing the second control voltage comprises:
adjusting a voltage across a capacitor based on the states of the first and second input signals, wherein the voltage across the capacitor comprises the second control voltage.

* * * * *